DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED AUGUST 18, 1970

877 O.G. 490

T877,008

PRODUCTION OF LITHOGRAPHIC PRINTING PLATES FROM DYE DEVELOPER IMAGES

Paul H. Stewart, % Eastman Kodak Company, 343 State St., Rochester, N.Y. 14650

Filed Feb. 3, 1970, Ser. No. 8,397
Int. Cl. G03c *5/54;* G03f *7/02*
U.S. Cl. 96—29
No Drawing. 17 Pages Specification

A lithographic printing plate is provided by processing an exposed photosensitive element comprising at least one light-sensitive silver halide emulsion layer and a dye developer, which is both a silver halide developing agent and a dye, contiguous to the silver halide of the silver halide emulsion layer, with an alkaline solution so as to develop a latent image in the regions of exposure of the silver halide emulsion layer. The dye developer is immobilized in the regions of exposure with the remaining dye developer diffusing imagewise in register to a hydrophilic dye developer reception element where it forms thereon an oleophilic image receptive of printing ink. The resulting reception element constitutes a positive-working lithographic plate which may then be moistened, inked and placed upon a lithographic printing press to produce up to 1000 positive lithographic prints. The reception element can comprise a metal such as aluminum with a hydrophilic coating, a fogged silver halide emulsion coated on a paper support or a support coated with a polymeric acid layer, a polymeric timing layer and a dye developer mordant layer. Washing and heat-treating the lithographic plate will improve the inking characteristics and longevity of the plate.